United States Patent [19]

Crookshanks

[11] Patent Number: 4,679,161

[45] Date of Patent: Jul. 7, 1987

[54] CALIBRATED OVERLAPPING FREQUENCY SWEEP

[75] Inventor: Rex J. Crookshanks, Palos Verdes Estates, Calif.

[73] Assignee: Hughes Aircraft Company, Los Angeles, Calif.

[21] Appl. No.: 679,516

[22] Filed: Dec. 7, 1984

[51] Int. Cl.$^4$ ............................................. H04B 15/00
[52] U.S. Cl. .................... 364/571; 364/574; 328/162; 328/163; 328/165
[58] Field of Search ............... 364/571, 574; 307/518, 307/520, 529; 328/162, 163, 164, 165, 55

[56] References Cited

U.S. PATENT DOCUMENTS

| | | | |
|---|---|---|---|
| 2,961,535 | 11/1960 | Lanning | 328/55 |
| 3,557,354 | 1/1971 | Trimble | 364/574 |
| 3,758,866 | 9/1973 | Hansen et al. | 328/164 |
| 3,869,673 | 3/1975 | Close | 328/163 |
| 4,192,003 | 3/1980 | Brock et al. | 328/165 |
| 4,260,951 | 4/1981 | Lewyn | 328/165 |
| 4,328,591 | 5/1982 | Baghdady | 328/165 |
| 4,462,001 | 7/1984 | Girard | 328/163 |
| 4,555,765 | 11/1985 | Crooke et al. | 364/571 |
| 4,587,620 | 5/1986 | Niimi et al. | 364/574 |

*Primary Examiner*—Parshotam S. Lall
*Attorney, Agent, or Firm*—J. A. Sawyer, Jr.; M. J. Meltzer; A. W. Karambelas

[57] ABSTRACT

An overlapping frequency sweep system (10) includes a complex multiplier (15) located between two reflective array compressors (RACs 13 and 21). The complex multiplier compensates for the distortions due to both RACs by modifying the phase and amplitude of the sweep at an intermediate point in its dispersion. This permits precise calibration of the individual sweeps between the time when they are in the form of pulses and when successive sweeps overlap.

A pulse source (11) provides a series of pulse inputs to the first RAC (13), the series having a predetermined period between successive pulses. The first RAC introduces differential delays as a function of frequency, the maximum differential delay introduced in a given sweep being equal to or less than the period of the pulse series. The remainder of the desired dispersion is applied by the second RAC (21). A limiter (23) provides a constant amplitude function of frequency input to the complex multiplier.

The complex multiplier multiplies the incoming signal by a sequence of complex digital words selected to compensate for the distortions introduced by the particular RACs in the system. The sequence of digital words is stored in a memory (ROM 17) and determined as disclosed. The ROM addressing is synchronized with the pulse firings by a timing generator (19).

8 Claims, 1 Drawing Figure

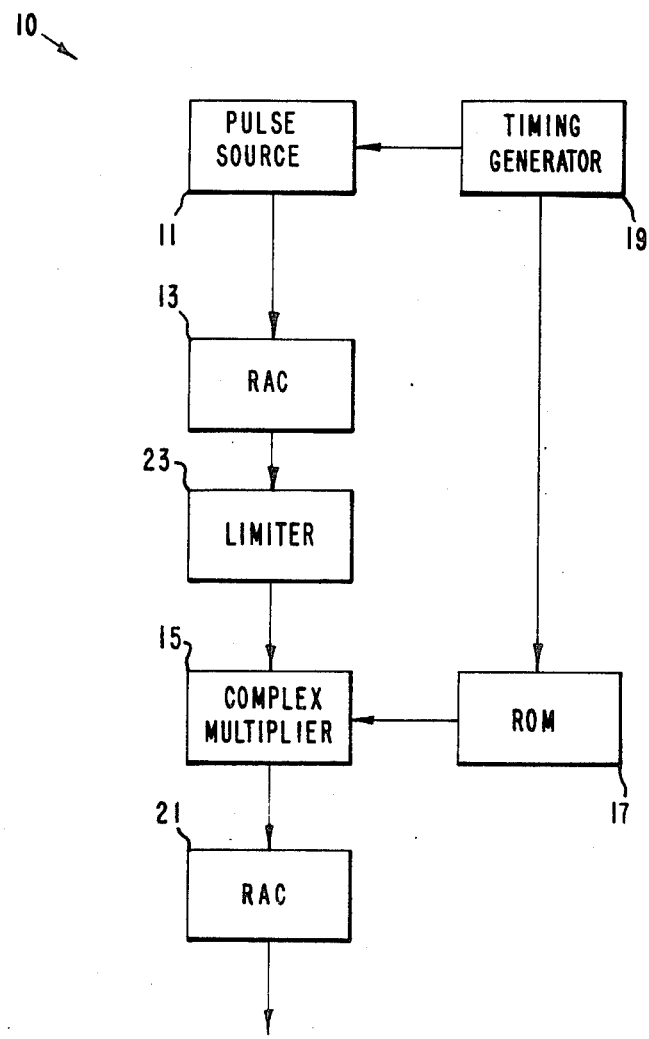

CALIBRATED OVERLAPPING FREQUENCY SWEEP

BACKGROUND OF THE INVENTION

The present invention relates to frequency sweeps and, more particularly, to overlapping frequency sweeps operating in the radio frequency range.

Many communications devices utilize frequency sweeps systems, e.g., demodulators, swept receivers and spectrum analyzers. The output of a frequency sweep system is a monotonic frequency function of time. An overlapping frequency sweep provides such functions which overlap in time. Such sweeps are produced when the time between sweeps is less than the differential delay introduced by the sweep.

Frequency sweeps are often produced by time dispersing a pulse as a function of frequency. The pulse is selected to have frequency components over the desired output range of the sweep. A device for adding time delays as a monotonic function of frequency then processes the signal to produce the sweep.

One such dispersion device is a "reflective array compressor" (RAC). The RAC can be manufactured by etching plural slits in a large quartz crystal. The size and placement of the slits determines the dispersion characteristics of the RAC. For example, a RAC can be designed to provide a linear or other specific sweep.

While RACs perform quickly and reliably, they are difficult to manufacture precisely. A RAC designed to produce a linear frequency sweep will generally have some characteristic non-linearities. The cost of manufacturing each RAC typically prohibits large scale rejection of deviating devices.

Consideration has been given to pre- and post-processing the signal to correct for the imprecisions in a RAC. However, it is quite difficult to precisely tune a pulse, so pre-processing has not proved a satisfactory approach. Post-processing is problematic in an overlapping frequency sweep since, at any given instant, the signal to be processed contains components from plural frequency sweeps.

SUMMARY OF THE INVENTION

In a novel frequency sweep system, distortions introduced by components of an overlapping frequency sweep are compensated at an intermediate point in the dispersion process. This intermediate processing avoids the difficulties of calibrating a pulse prior to dispersion and of individually correcting overlapping sweeps after dispersion.

The frequency sweep system includes a pulse source which provides pulse inputs with a period between pulses less than the desired differential delay in individual sweeps so as to produce overlapping sweeps. The desired sweep is applied by first and second RACs or other analog dispersion means. The first RAC applies a differential delay to a pulse which is equal to or less than the period of the pulse source. The bulk of the remaining dispersion is provided by the second RAC.

A complex multiplier, or other signal processor, is located between the RACs. In this location, the complex multiplier operates upon, not a pulse or overlapping sweeps, but a single sweep. At this point in the dispersion process, calibrations can be applied to each sweep precisely and individually. The complex multiplier simultaneously post-modulates to compensate for the distortions introduced by the first RAC and premodulates to compensate for the distortions of the second RAC.

In one realization of the invention, the signal processor multiplies the dispersed output of the RAC by a succession of digital words. The digital words can be complex, so that phase and amplitude can be adjusted, and can include a sign bit to produce gains as well as attenuations. The digital words can be determined as disclosed herein, and stored in a memory for actuation by a timing generator, which synchronizes the pulse firings and provides the memory addressing. A limiter inserted between the first RAC and the complex multiplier limits the amplitude correction required by the signal processor.

Accordingly, an overlapping frequency sweep system is provided which utilizes the advantages of present RAC dispersion devices, and yet provides much greater precision and control in the determination of the shape of the frequency sweep output.

BRIEF DESCRIPTION OF THE DRAWING

FIG. 1 is a schematic of an overlapping frequency sweep system in accordance with the present invention.

DESCRIPTION OF THE PREFERRED EMBODIMENTS

An overlapping frequency sweep system 10 is shown in FIG. 1 comprising a pulse source 11, a first RAC 13, a complex multiplier 15, and a second RAC 21. The RACs 13 and 21 are analog signal dispersers which introduce differential delays in signals conveyed therethrough; the delays are monotonic functions of frequency. The complex multiplier 15 is a signal processor which serves to post-modulate the output of the first RAC 13 and pre-modulate the input of the second RAC 21 to compensate for distortions introduced by the RACs to attain the desired sweep form. The output of the illustrated frequency sweep 10 system is a linear frequency sweep.

The complex multiplier 15 introduces a time varying transfer function to the dispersed pulse. The illustrated complex multiplier is a radio frequency multiplying digital-to-analog converter (MDAC). More specifically, the complex multiplier 15 multiplies the analog signal with a succession of complex digital words, each including a sign bit. This allows modification of the amplitude and phase of the incoming signal as a function of time.

The succession of digital words is stored in an ROM 17 and introduced word-by-word in response to timing signals from a timing generator 19. The timing generator 19 also fires the pulse source 11 so as to synchronize the pulse and succession of digital words.

The complex multiplier 15 can more precisely tune a signal which is already close to the desired frequency sweep. Therefore, the RACs 13 and 21 are designed to provide linear frequency sweeps. Furthermore, in order to achieve a constant amplitude frequency sweep, a limiter 23 is inserted between the first RAC 13 and the complex multiplier 15.

The operation of the frequency sweep system 10 is as follows. The RAC timing generator 19 triggers the pulse source to form a series of pulses, with a given period between pulses. Each pulse contains a full spectrum of frequencies over the desired sweep range.

The first RAC 13 disperses the pulses according to a linear, or other monotonic, function of frequency. The difference between the maximum delay and the minimum delay introduced is equal to, or slightly less than, the period of the pulse source 11. The dispersion is not so great as to create overlapping of successive pulses.

The RACs 13 and 21 are designed to cooperate to produce the desired sweep form. In the illustrated system, the desired form is a linear sweep, which is effected by designing both RACs 13 and 21 with nominally linear dispersion patterns. The limiter 23 equalizes the amplitudes as a function of frequency of the multiplier inputs to provide a constant amplitude approximately linear frequency sweep.

The complex multiplier 15 post-modulates the rough sweep output of the limiter 23 to compensate for the non-linearities of the first RAC 13. At the same time, the complex multiplier 15 pre-modulates the input to the second RAC 21 to compensate for its non-linearities.

The timing generator 19 provides the address generation for the ROM 17. In operation, the timing generator 19 steps the ROM 17 through the succession of digital words which are respectively multiplied against segments of the rough sweep. For example, the rough sweep can be divided into, for example, 128 adjacent and equal time segments, each of these segments being multiplied by a predetermined digital word.

The function, or succession of digital words, stored in the ROM 17 is selected to compensate for the peculiarities in the specific RACs 13 and 21. The function is calculated from measurements by a network analyzer which measures the phase information between the input of the first RAC 13 and the output of the second RAC 21.

In one method of calculating the ROM function, the network analyzer is used to determine the actual phase transfer characteristic of the frequency sweep system with the complex multiplier 15 held at a constant amplitude and phase shift. This actual function is compared with that of an ideal system. The actual function can be expressed as a polynomial expansion of the form $$K_O + K_1 t + K_2 t^2 + R$$

where R is a polynomial with terms of third order and higher. The constants $K_i$ and those in R are complex numbers reflecting both amplitude and phase information. Experience indicates that this polynomial converges rapidly, and that terms greater than 10th order are unnecessary for the present application.

Since frequency is a derivative of phase, the polynomial expansion of the desired phase function of time includes a quadratic term, the constant for which is half the slope of the desired frequency sweep. The constant and linear terms do not affect linearity, but third and higher order terms should be absent. Thus, the ideal function can be expressed:

$$M_O + M_1 t + M_2 t^2.$$

By subtracting the actual from the ideal, the correction term is obtained:

$$(M_O - K_O) + (M_1 - K_1)t + (M_2 - K_2)t^2 - R.$$

The function stored in the ROM is e, the natural logarithm, raised to this correction term. This function is evaluated at the required instants, 128 in the present case, to produce the succession of digital words. The resulting words are delivered to the complex multiplier as dictated by the RAC timing generator 19. The result of the multiplication is a signal premodulated so as to compensate for the non-linearities introduced by the second RAC 21. Thus, the output of the second RAC 21 is a series of overlapping linear frequency sweeps.

The values of $M_O$ and $M_1$ represent the amplitude and onset time of the frequency sweep, and can be set accordingly. Otherwise, since the values of $M_O$ and $M_1$ do not affect linearity, they can be set to eliminate the constant and linear terms of the correction terms, i.e., $M_O = K_O$ and $M_1 = K_1$.

In an alternative method for calculating the ROM function, the complex multiplier 15 is supplied with a constant amplitude and phase shift, and the transfer characteristic of the frequency from its input to its output is measured using a network analyzer. The result is a phase function of frequency and time. This function is expanded in a set of complex Legendre polynomials. Simulation studies have indicated that the first ten terms of the expansion form a suitable approximation for the present purposes. Thus, the correction coefficients are calculated by forming the factor:

$$K_{oc}P_0(f,t) \times [K_{oc}P_0(f,t) + K_{1c}P_1(f,t) +$$

$$K_{2c}P_2(f,t) + \ldots + K_{9c}P_9(f,t)]^{-1}.$$

The proper time base in which the above correction factor is used can be determined by measuring the linear and quadratic phase term of the first RAC 13 and the limiter 23 and rationing these values against the linear and quadratic phase term of the system 10 from the input to the first RAC 13 to the output of the second RAC 21.

In accordance with the foregoing, the invention provides overlapping rf frequency sweeps with improved performance given the limitations of certain physical components. Specifically, the disclosed system permits precise calibration of a frequency sweep system at an intermediate point in the dispersion process to avoid the difficulties of tuning undispersed pulses and overlapping sweeps.

Many variations and modifications are possible, including different desired sweep patterns, different frequency ranges and slopes, and different approaches to calculating correction factors. These and other embodiments are within the scope of the present invention which is defined in the following claims.

What is claimed is:

1. A frequency sweep system having an output characterized by a predetermined frequency that is a function of time comprising:
    means for providing pulses with a period between pulses;
    a first dispersion means for applying a first differential delay which is less tha the period of the providing means;
    a second dispersion means responsive to the first dispersion means for applying a second differential delay to the pulse; and
    a complex multiplier coupled between the first and second dispersion means for simultaneous compensation for distortions introduced by the first and second dispersion means to provide a plurality of overlapping frequency sweeps.

2. The frequency sweep system of claim 1 further characterized in that said complex multiplier multiplies the output of said first dispersion means by a succession of digital words.

3. The frequency sweep system of claim 2 further characterized in that said digital words are complex digital words.

4. The frequency sweep system of claim 2 further characterized in that said digital words include a sign bit.

5. The frequency sweep system of claim 2 further comprising a smoothing filter for smoothing the output of said complex multiplier.

6. The frequency sweep system of claim 2 further comprising timing coordinating means for coordinating the introduction of said pulses with the succession of digital words.

7. The frequency sweep system of claim 1 further comprising a limiter for modifying the output of said first dispersion means so that its output conforms to a predetermined amplitude function of frequency, the output of said limiter providing the input to said second dispersion means.

8. The frequency sweep system of claim 1 further characterized in that said first and second dispersion means are reflective array compressors.

* * * * *